(12) United States Patent
Venkatagiriyappa et al.

(10) Patent No.: US 12,217,981 B2
(45) Date of Patent: Feb. 4, 2025

(54) LID SEPARATION DEVICE FOR VACUUM CHAMBER

(71) Applicant: Applied Materials, Inc., Santa Clara, CA (US)

(72) Inventors: Vijayabhaskara Venkatagiriyappa, Bangalore (IN); Srinivas Ramakrishna, Bangalore (IN); Mario Daniel Sanchez, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 311 days.

(21) Appl. No.: 17/689,453

(22) Filed: Mar. 8, 2022

(65) Prior Publication Data

US 2023/0290655 A1    Sep. 14, 2023

(51) Int. Cl.
*H01L 21/67*    (2006.01)
(52) U.S. Cl.
CPC .............................. *H01L 21/67126* (2013.01)
(58) Field of Classification Search
CPC .......................... H01L 21/6719; C23C 16/458
See application file for complete search history.

(56) References Cited

U.S. PATENT DOCUMENTS

| 2007/0054604 A1* | 3/2007 | Scott | B24D 15/06 451/357 |
| 2012/0084940 A1* | 4/2012 | Tsai | B60B 33/0039 16/37 |

\* cited by examiner

*Primary Examiner* — Joseph A Miller, Jr.
(74) *Attorney, Agent, or Firm* — Moser Taboada

(57) ABSTRACT

Lid separators for vacuum processing chamber lid separation and vacuum processing chambers incorporating same are provided herein. In some embodiments, a lid separator for a vacuum processing chamber includes: a shaft having a first end and an opposing second end, wherein the shaft is threaded along at least a first portion of the shaft; and a contact pad having an outer diameter greater than an outer diameter of the shaft, a recess disposed in a first side of the contact pad, and a central opening disposed through a second side of the contact pad, opposite the first side, and into the recess, wherein the shaft is coupled to the contact pad, wherein the first end of the shaft extends through the central opening and into the recess without reaching the first side of the contact pad, and wherein the first portion and the second end of the shaft extend away from the second side of the contact pad.

20 Claims, 2 Drawing Sheets

LID SEPARATION DEVICE FOR VACUUM CHAMBER

FIELD

Embodiments of the present disclosure generally relate to vacuum processing systems, and more particularly, to semiconductor substrate processing chambers.

BACKGROUND

Periodically, a lid assembly of a vacuum processing chamber in a vacuum semiconductor processing tool needs to be opened to provide access to the interior of the chamber. The inventors have observed some systems for separating the lid can lead to a screw head touching the chamber body, which can damage the body and is also a potential cause for failure. For example, lid separation for preventive maintenance can damage a nickel-plated chamber body due to a screw head of the mechanism provided for separating the lid from the chamber body undesirably contacting and rubbing against the chamber body. Damage to the chamber body surface can lead to rejection of the chamber body part because of cosmetics and/or due to vacuum leaks. Nickel plating damage can also lead to particle generation, copper contamination from an underlying chamber body material (e.g., aluminum) on wafer/substrate and ultimately can lead to wafer production loss.

Accordingly, the inventors have provided an improved lid separators for vacuum processing chambers and vacuum processing chamber incorporating such lid separators.

SUMMARY

Lid separators for vacuum processing chamber lid separation and vacuum processing chambers incorporating same are provided herein. In some embodiments, a lid separator for a vacuum processing chamber includes: a shaft having a first end and an opposing second end, wherein the shaft is threaded along at least a first portion of the shaft; and a contact pad having an outer diameter greater than an outer diameter of the shaft, a recess disposed in a first side of the contact pad, and a central opening disposed through a second side of the contact pad, opposite the first side, and into the recess, wherein the shaft is coupled to the contact pad, wherein the first end of the shaft extends through the central opening and into the recess without reaching the first side of the contact pad, and wherein the first portion and the second end of the shaft extend away from the second side of the contact pad.

In some embodiments, a lid separator for a vacuum processing chamber includes: a shaft having a first end and an opposing second end, wherein the shaft is threaded along at least a first portion of the shaft, and wherein the shaft includes a first step having a first reduced diameter disposed adjacent to the first portion and a second step having a second reduced diameter, smaller than the first reduced diameter, disposed adjacent to the first step and between the first step and the first end of the shaft; a bushing disposed about the shaft adjacent to a first shoulder of the shaft defined by the first step; a contact pad disposed about the shaft adjacent to a second should of the shaft defined by the second step, the contact pad having an outer diameter greater than an outer diameter of the shaft, a recess disposed in a first side of the contact pad, and a central opening disposed through a second side of the contact pad, opposite the first side, and into the recess, wherein the shaft is coupled to the contact pad, wherein the first end of the shaft extends through the central opening and into the recess without reaching the first side of the contact pad, and wherein the first portion and the second end of the shaft extend away from the second side of the contact pad; and a retaining ring disposed in an annular groove disposed about the second step of the shaft, wherein the retaining ring is configured to retain the bushing and the contact pad on the shaft.

In some embodiments, a drive feature can be disposed in at least one of the first end or the second end of the shaft.

In some embodiments, a head is disposed on the second end of the shaft. In some embodiments, the second end of the shaft has no head.

In some embodiments, one or more locking features are provided to prevent rotation of the bushing with respect to the shaft. In some embodiments, the one or more locking features include one or more flat portions disposed about the circumference of the first step, wherein a central opening of the bushing has a mating profile.

In some embodiments, a vacuum processing chamber includes: a chamber body; a lid disposed atop the chamber boy and, together with the chamber body, at least partially defining an inner volume of the vacuum processing chamber; and one or more lid separators as described in any of the embodiments herein. The lid separators are disposed in one or more corresponding threaded openings in the lid such that rotation of the lid separator in a first direction can advance the contact pad of the lid separator toward and into contact with the chamber body sufficiently to cause the lid to separate from the chamber body, wherein the lid further includes a lid recess disposed in a side of the lid that faces the chamber body and intersecting the threaded opening, the lid recess having a size sufficient to receive the entirety of the contact pad of the lid separator such that the lid can contact the chamber body while the contact pad is disposed within the lid recess.

In some embodiments, a vacuum gasket is disposed between the chamber body and the lid in a corresponding groove disposed in at least one of facing surfaces of the chamber body or the lid.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
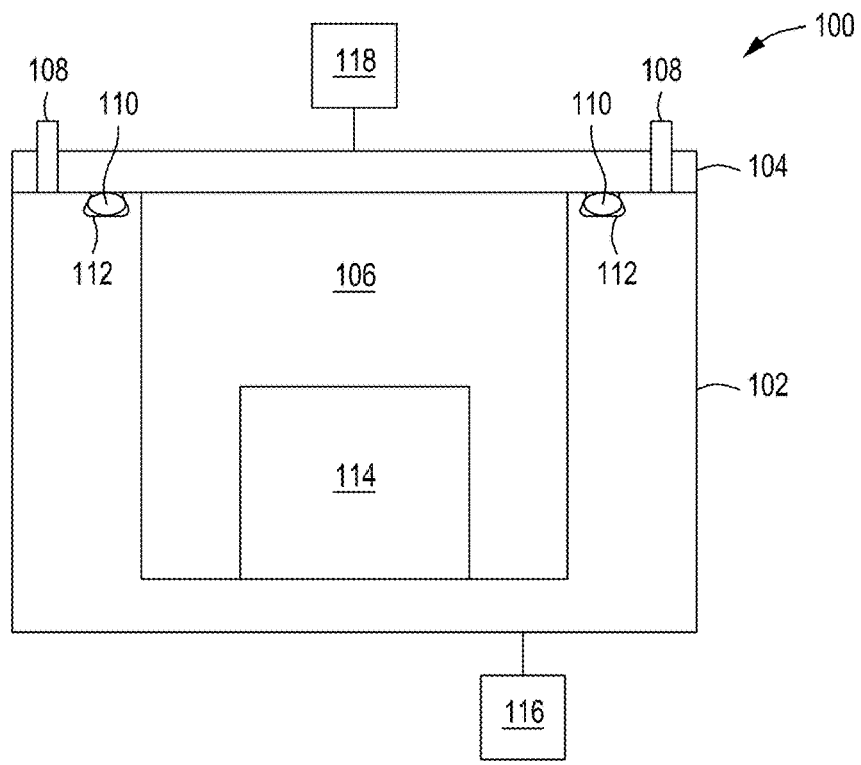
FIG. 1 is a schematic side view of a vacuum processing chamber having a lid separator in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Lid separators for vacuum processing chamber lid separation and vacuum processing chambers incorporating same are provided herein. The lid separators advantageously prevent metal contact and rubbing when operating the lid separators to separate a lid from a chamber body of a vacuum processing chamber. The lid separators can also be used in non-vacuum environments as well. In addition, in some embodiments, the lid separators can advantageously be pre-assembled and easily installed as a unit within the lid of a processing chamber, leading to reduced processing chamber downtime for assembly and installation of the lid separators.

FIG. 1 is a schematic side view of a vacuum processing chamber 100 having a lid separator 108 in accordance with at least some embodiments of the present disclosure. The vacuum processing chamber 100 depicted in FIG. 1 is purely for illustrative purposes and is not intended to be limiting with respect to the lid separator 108, which can be used in other processing chambers in accordance with the teachings provided herein. In general, the vacuum processing chamber 100 includes a chamber body 102 and a lid 104. The chamber body 102 and the lid 104 together at least partially defining an inner volume 106 of the vacuum processing chamber 100.

The vacuum processing chamber 100 typically further includes various additional components for processing substrates, depending upon configuration for particular processing applications. For example, the vacuum processing chamber 100 can include a gas supply 118 for providing one or more gases to the inner volume 106. For example, a showerhead, nozzles, or other openings in the lid 104 and/or chamber body 102 can be used to provide process gases to the inner volume 106.

An exhaust system 116 is provided to evacuate the inner volume 106 of process gases or reaction byproducts and to maintain a desired pressure within the inner volume 106. In some embodiments, the desired pressure can be a vacuum pressure. For example, the exhaust system 116 can include one or more pump ports, valves, vacuum pumps, and the like.

Additional processing components 114 can be disposed within the inner volume 106 of the vacuum processing chamber 100. Illustrative processing components 114 can include substrate supports, process kits, chamber liners, or the like. Other components, not shown for simplicity, can be disposed within or outside of the inner volume such as, substrate thermal management apparatus (heating or cooling apparatus), RF or microwave energy sources, slit valve openings, or the like.

One or more lid separators 108 are disposed in corresponding threaded openings in the lid 104 such that rotation of the one or more lid separators 108 can advance the lid separator toward and into contact with the chamber body 102 sufficiently to cause the lid 104 to separate from the chamber body 102. In some embodiments, two lid separators 108 are disposed in corresponding threaded openings in the lid 104. In some embodiments, two or more lid separators 108 are disposed in corresponding threaded openings in the lid 104. The number of lid separators provided can impact the amount of force each lid separator is required to bear when separating the lid from the chamber body, with more lid separators reducing the amount of force needed to be borne be any individual lid separator.

In some embodiments, a vacuum gasket 110 can be disposed between the chamber body 102 and the lid 104 in a corresponding groove 112 disposed in at least one of facing surfaces of the chamber body 102 or the lid 104. In the illustrative embodiment depicted in FIG. 1, the groove 112 is disposed in a top wall surface of the chamber body 102 that faces the lid 104. In operation, when the lid 104 is disposed on the chamber body 102, the vacuum gasket 110 facilitates minimizing or preventing leaks into or out of the inner volume 106. In particular, when operating at vacuum pressure, the vacuum gasket 110 facilitates minimizing or preventing leaks into the inner volume 106.

Figure 2:
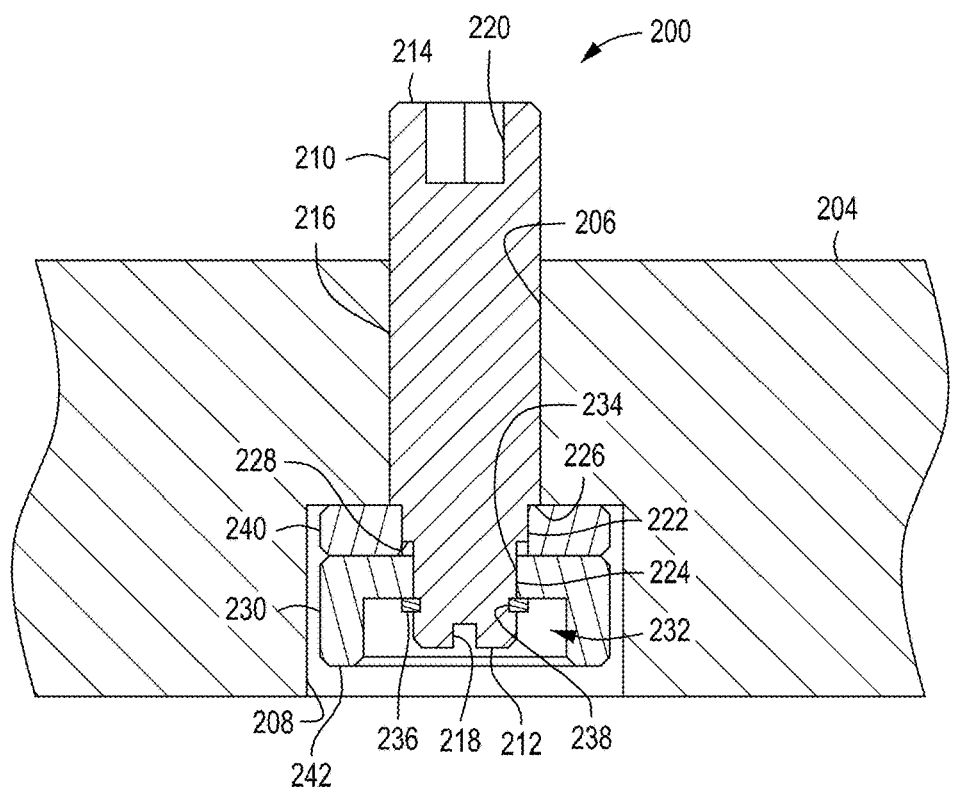
FIG. 2 is a partial side view in cross-section showing a lid separator disposed in a processing chamber lid in accordance with at least some embodiments of the present disclosure.

FIG. 2 is a partial side view in cross-section showing a lid separator 200 disposed in a processing chamber lid (lid 204) in accordance with at least some embodiments of the present disclosure. The lid separator 200 can be used as the lid separator 108 discussed above. The lid 204 can be the lid 104 discussed above.

The lid 204 includes a threaded opening 206 extending through the lid 204 from a side of the lid 204 opposite the chamber body (e.g., chamber body 102 discuss above) to a side of the lid 204 facing the chamber body.

A lid recess 208 is disposed in a side of the lid 204 that faces the chamber body. The lid recess 208 intersects the threaded opening 206. In some embodiments, the lid recess 208 is concentric with the threaded opening 206. The lid recess 208 has a size (e.g., diameter/width and depth) sufficient to receive the entirety of a contact pad of the lid separator 200, as described further below, such that the lid 204 can contact the chamber body while the contact pad is disposed within the lid recess 208 (e.g., the lid 204 can be in contact with the chamber body without interference from the lid separator 200 or without the lid separator 200 contacting the chamber body).

The lid separator 200 generally includes a shaft 210 having a first end 212 and an opposing second end 214. The shaft 210 is threaded along at least a first portion 216 of the shaft 210. In some embodiments, the shaft may include relief formed at at least one of the first end 212 or the second end 214, such as a radius, bevel, chamfer, or the like. The shaft 210 can be fabricated from any process compatible material suitable to withstand the forces on the threads and expected temperatures during processing. For example, the shaft can be fabricated from a metal, such as a high ductile steel or a stiff steel alloy, for example stainless steel.

In some embodiments, a drive feature is disposed in at least one of the first end 212 or the second end 214 of the shaft 210. In some embodiments, a drive feature is disposed in each of the first end 212 and the second end 214 of the shaft 210. In the embodiment depicted in FIG. 2, a drive feature 218 is disposed at the first end 212 of the shaft 210 and a drive feature 220 is disposed at the second end 214 of the shaft 210. The drive feature can be a recess disposed in either or both end surfaces of the shaft 210, for example disposed axially into the end surfaces of the shaft 210, to facilitate driving or rotation of the shaft 210 using a suitable tool having a corresponding feature that mates with the shape of the drive feature recess (e.g., a slot, cross, triangle, square, hexagon, star, or any other suitable shape).

Providing a drive feature in the top (e.g., second end 214) of the lid separator advantageously facilitates rotation of the lid separator to advance (e.g., move contact pad toward chamber body) or retract (e.g., move contact pad away from chamber body) the contact pad of the lid separator. Providing a drive feature in the bottom (e.g., first end 212) of the lid separator advantageously facilitates rotation of the lid separator to more rapidly install the lid separator through the bottom of the lid.

In some embodiments, the first portion 216 of the shaft 210 has the largest diameter of the shaft 210. In some embodiments, the shaft 210 includes a first step 222 having a first reduced diameter disposed adjacent to the first portion 216. The first step 222 defines a first shoulder 226 where the diameter of the shaft 210 changes from the first portion 216 to the first step 222. In some embodiments, the shaft 210 further includes a second step 224 having a second reduced diameter, smaller than the first reduced diameter, disposed adjacent to the first step 222 and between the first step 222 and the first end 212 of the shaft 210. The second step 224 defines a second shoulder 228 where the diameter of the shaft 210 changes from the first step 222 to the second step 224.

A contact pad 230 is coupled to the shaft 210. The contact pad 230 has an outer diameter that is greater than an outer diameter of the shaft 210. A recess 232 is disposed in a first side of the contact pad 230. A central opening 234 is disposed through a second side of the contact pad 230, opposite the first side, and into the recess 232. The first end 212 of the shaft 210 extends through the central opening 234 and into the recess 232 without reaching the first side of the contact pad 230. The first portion 216 and the second end 214 of the shaft extend away from the second side of the contact pad 230 (e.g., in a direction opposite the recess 232). The first side of the contact pad 230 defines a contact surface 242 configured to press against the chamber body when the lid separator is rotated to extend the lid separator from the bottom surface of the lid 204. The contact pad can be fabricated from any process-compatible polymer that is non-marring against the chamber body and provides thermal degradation resistance, such as polyether ether ketone (PEEK).

In some embodiments, the contact pad 230 is disposed about the second step 224 of the shaft 210. For example, in some embodiments, the central opening 234 may have a diameter that is larger than the diameter of the second step 224 and that is smaller than the diameter of the first step 222.

In some embodiments, a retaining ring 236 is disposed in an annular groove 238 disposed about the shaft 210 to retain the contact pad 230 on the shaft. In some embodiments, and as depicted in FIG. 2, the annular groove is disposed about the second step 224 of the shaft 210. The retaining ring 236 has an outer diameter that is larger than the diameter of the central opening 234 of the contact pad 230. The retaining ring 236 can be fabricated from any suitable process-compatible material, such as a metal, for example stainless steel.

In some embodiments, the contact pad 230 has freedom to rotate with respect to the shaft 210. By allowing the contact pad 230 to rotate with respect to the shaft 210, the contact pad 230 can advantageously remain fixed with respect to the chamber body when contacting the chamber body. By not rotating or moving with respect to the chamber body, the lid separator can advantageously separate the lid from the chamber body without rubbing against the chamber body, thereby reducing or eliminating particles and potential damage to the chamber body surface.

In some embodiments, a bushing 240 can be disposed about the shaft 210 adjacent to the contact pad 230 and between the contact pad 230 and the second end 214 of the shaft 210. In some embodiments, the bushing 240 is disposed about the first step 222 of the shaft 210 and rests against the first shoulder 226 of the shaft 210 defined by the first step 222. For example, the diameter of a central opening of the bushing 240 is larger than the diameter of the first step 222 and smaller than the diameter of the first portion 216 of the shaft 210. The bushing 240 can be fabricated from any suitable process-compatible material, such as a metal, for example stainless steel.

Figure 3:
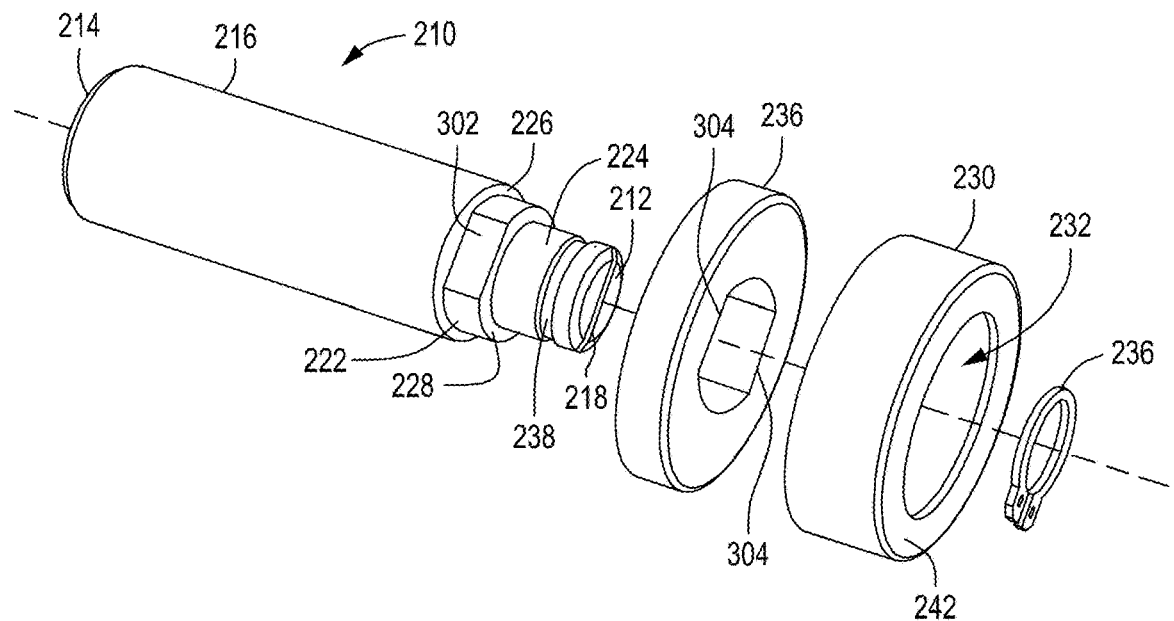
FIG. 3 is an exploded isometric view of a lid separator in accordance with at least some embodiments of the present disclosure.

In some embodiments, the shaft 210 and the bushing 240 include one or more locking features to prevent rotation of the bushing 240 with respect to the shaft 210. For example, as best seen in FIG. 3, which is an exploded isometric view of a lid separator in accordance with at least some embodiments of the present disclosure, the one or more locking features can include one or more flat portions 302 disposed about the circumference of the first step, wherein a central opening of the bushing 240 has a mating profile (e.g., corresponding flat portions 304).

Figure 4:
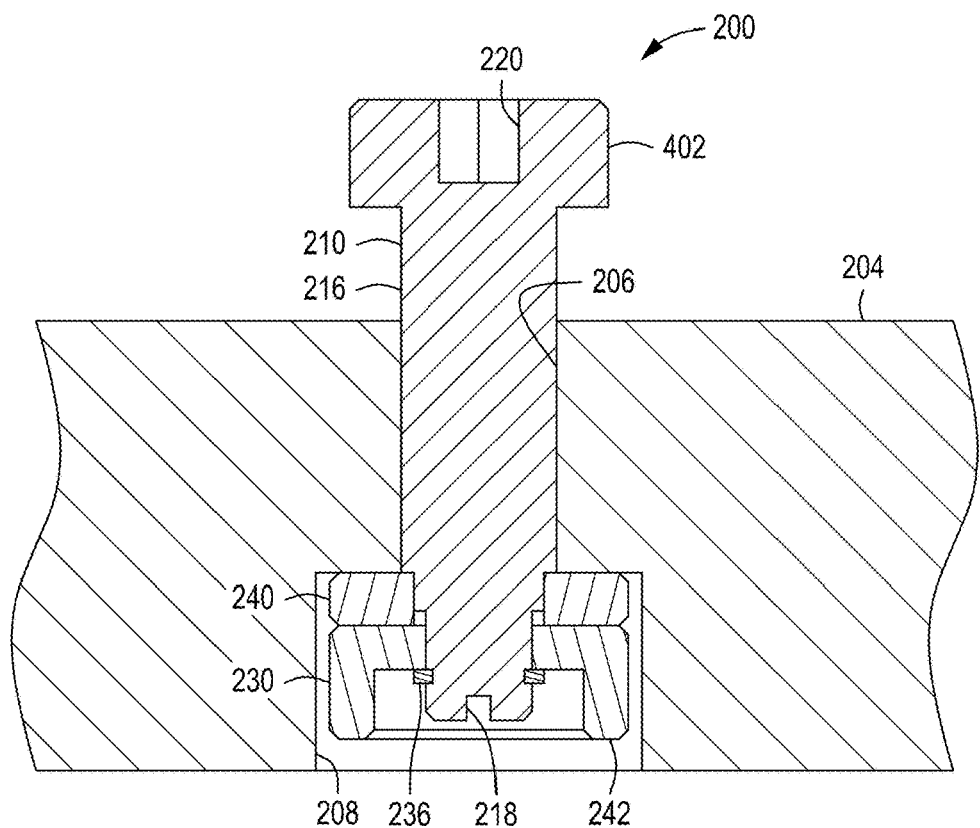
FIG. 4 is a partial side view in cross-section showing a lid separator disposed in a vacuum processing chamber lid in accordance with at least some embodiments of the present disclosure.

In some embodiments, the shaft 210 does not include a head at the second end 214 and the threaded first portion 216 extends to the second end 214 of the shaft 210. Alternatively, in some embodiments and as depicted in FIG. 4, which is a partial side view in cross-section showing a lid separator in accordance with at least some embodiments of the present disclosure, a head 402 can be disposed on the second end 214 of the shaft 210. Embodiments of a lid separator without a head at the second end 214 of the shaft 210 and wherein the threaded first portion 216 extends to the second end 214 advantageously facilitate easy installation of an assembled lid separator in the lid, as compared to embodiments having a head that would require screwing the shaft into the lid without the bushing or contact pad in place and then finishing assembly of the lid separator. In addition, embodiments of a lid separator without a head at the second end 214 of the shaft 210 and wherein the threaded first portion 216 extends to the second end 214 advantageously facilitate extension of the lid separator into the threaded opening of the lid (e.g., threaded opening 206 of lid 204) such that the shaft of the lid separator can be made shorter than in embodiments having a head.

In one exemplary configuration, a lid separator for a vacuum processing chamber can include a shaft 210 having a first end 212 and an opposing second end 214, wherein the shaft 210 is threaded along at least a first portion 216 of the shaft 210, and wherein the shaft 210 includes a first step 222 having a first reduced diameter disposed adjacent to the first portion 216 and a second step 224 having a second reduced diameter, smaller than the first reduced diameter, disposed adjacent to the first step 222 and between the first step 222 and the first end 212 of the shaft 210. A bushing 240 can be disposed about the shaft 210 adjacent to a first shoulder 226 of the shaft 210 defined by the first step 222. A contact pad 230 can be disposed about the shaft 210 adjacent to a second shoulder 228 of the shaft 210 defined by the second step 224. The contact pad 230 has an outer diameter greater than an outer diameter of the shaft 210, a recess 232 disposed in a first side of the contact pad 230, and a central opening 234 disposed through a second side of the contact pad 230, opposite the first side, and into the recess 232. The shaft 210 is coupled to the contact pad 230, wherein the first end 212 of the shaft 210 extends through the central opening 234 and into the recess 232 without reaching the first side (contact surface 242) of the contact pad 230, and wherein the first portion 216 and the second end 214 of the shaft 210 extend away from the second side of the contact pad 230. A retaining ring 236 is disposed in an annular groove 238 disposed in the second step 224 of the shaft 210. The retaining ring 236 is configured to retain the bushing 240 and the contact pad 230 on the shaft 210. Optionally, a drive feature can be disposed in at least one of the first end 212 or the second end 214 of the shaft 210.

In operation, one or more lid separators as described in above are disposed corresponding threaded openings in the lid such that rotation of the lid separator in a first direction can advance the contact pad of the lid separator toward and into contact with the chamber body sufficiently to cause the lid to separate from the chamber body. The lid includes a lid recess disposed in a side of the lid facing the chamber body and intersecting the threaded opening such that the entirety of the contact pad of the lid separator can be disposed completely within the recess when the lid separator is in a retracted position. Accordingly, the lid can contact the chamber body without interference from the lid separator while the contact pad is completely disposed within the lid recess.

While the foregoing is directed to embodiments of the present disclosure, other and further embodiments of the disclosure may be devised without departing from the basic scope thereof.

The invention claimed is:

1. A lid separator for a vacuum processing chamber, comprising:
   a shaft having a first end and an opposing second end, wherein the shaft is threaded along at least a first portion of the shaft; and
   a contact pad having an outer diameter greater than an outer diameter of the shaft, a recess disposed in a first side of the contact pad, and a central opening disposed through a second side of the contact pad, opposite the first side, and into the recess, wherein the shaft is coupled to the contact pad, wherein the first end of the shaft extends through the central opening and into the recess without reaching the first side of the contact pad, and wherein the first portion and the second end of the shaft extend away from the second side of the contact pad.

2. The lid separator of claim 1, further comprising:
   a bushing disposed about the shaft adjacent to the contact pad and between the contact pad and the second end of the shaft.

3. The lid separator of claim 1, further comprising:
   a retaining ring disposed in an annular groove disposed about the shaft, wherein the retaining ring is configured to retain the contact pad on the shaft.

4. The lid separator of claim 1, further comprising:
   a drive feature disposed in at least one of the first end or the second end of the shaft.

5. The lid separator of claim 1, further comprising:
   a drive feature disposed in each of the first end and the second end of the shaft.

6. The lid separator of claim 1, further comprising:
   a head disposed on the second end of the shaft.

7. The lid separator of claim 1, wherein the first portion of the shaft has the largest diameter of the shaft, and wherein the shaft further comprises:
   a first step having a first reduced diameter disposed adjacent to the first portion; and
   a second step having a second reduced diameter, smaller than the first reduced diameter, disposed adjacent to the first step and between the first step and the first end of the shaft.

8. The lid separator of claim 7, further comprising:
   a bushing disposed about the shaft adjacent to a first shoulder of the shaft defined by the first step.

9. The lid separator of claim 8, further comprising:
   one or more locking features to prevent rotation of the bushing with respect to the shaft.

10. The lid separator of claim 9, wherein the one or more locking features include one or more flat portions disposed about the circumference of the first step, wherein a central opening of the bushing has a mating profile.

11. The lid separator of claim 7, wherein the shaft does not include a head and the threaded first portion extends from the second end of the shaft to the first step.

12. A lid separator for a vacuum processing chamber, comprising:
    a shaft having a first end and an opposing second end, wherein the shaft is threaded along at least a first portion of the shaft, and wherein the shaft includes a first step having a first reduced diameter disposed adjacent to the first portion and a second step having a second reduced diameter, smaller than the first reduced diameter, disposed adjacent to the first step and between the first step and the first end of the shaft;
    a bushing disposed about the shaft adjacent to a first shoulder of the shaft defined by the first step;
    a contact pad disposed about the shaft adjacent to a second shoulder of the shaft defined by the second step, the contact pad having an outer diameter greater than an outer diameter of the shaft, a recess disposed in a first side of the contact pad, and a central opening disposed through a second side of the contact pad, opposite the first side, and into the recess, wherein the shaft is coupled to the contact pad, wherein the first end of the shaft extends through the central opening and into the recess without reaching the first side of the contact pad, and wherein the first portion and the second end of the shaft extend away from the second side of the contact pad; and
    a retaining ring disposed in an annular groove disposed about the second step of the shaft, wherein the retaining ring is configured to retain the bushing and the contact pad on the shaft.

13. The lid separator of claim 12, further comprising:
    a drive feature disposed in at least one of the first end or the second end of the shaft.

14. The lid separator of claim 12, further comprising:
    a drive feature disposed in each of the first end and the second end of the shaft.

15. The lid separator of claim 12, further comprising:
    a head disposed on the second end of the shaft.

16. The lid separator of claim 12, further comprising:
    one or more locking features to prevent rotation of the bushing with respect to the shaft.

17. The lid separator of claim 16, wherein the one or more locking features include one or more flat portions disposed about the circumference of the first step, wherein a central opening of the bushing has a mating profile.

18. The lid separator of claim 12, wherein the shaft does not include a head and the threaded first portion extends from the second end of the shaft to the first step.

19. A vacuum processing chamber, comprising:
    a chamber body;
    a lid disposed atop the chamber boy and, together with the chamber body, at least partially defining an inner volume of the vacuum processing chamber; and
    one or more lid separators as described in claim 1 disposed in one or more corresponding threaded openings in the lid such that rotation of the lid separator in a first direction can advance the contact pad of the lid separator toward and into contact with the chamber body sufficiently to cause the lid to separate from the chamber body, wherein the lid further includes a lid recess disposed in a side of the lid that faces the chamber body and intersecting the threaded opening, the lid recess having a size sufficient to receive the entirety of the contact pad of the lid separator such that the lid can contact the chamber body while the contact pad is disposed within the lid recess.

20. The vacuum processing chamber of claim 19, further comprising:
a vacuum gasket disposed between the chamber body and the lid in a corresponding groove disposed in at least one of facing surfaces of the chamber body or the lid.

* * * * *